United States Patent
Fan et al.

(10) Patent No.: US 7,938,665 B2
(45) Date of Patent: May 10, 2011

(54) SOCKET HAVING ENGAGING CLUMP

(75) Inventors: Chia-Wei Fan, Tu-cheng (TW);
Nan-Hung Lin, Tu-cheng (TW); Fu-Pin Hsieh, Tu-cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 74 days.

(21) Appl. No.: 12/380,825

(22) Filed: Mar. 3, 2009

(65) Prior Publication Data

US 2009/0221158 A1    Sep. 3, 2009

(30) Foreign Application Priority Data

Mar. 3, 2008 (TW) .............................. 97203556 U

(51) Int. Cl.
*H01R 13/62* (2006.01)
(52) U.S. Cl. ........................................... 439/326
(58) Field of Classification Search .................. 439/326, 439/330, 331, 73, 70, 71
See application file for complete search history.

(56) References Cited

U.S. PATENT DOCUMENTS

| 6,164,980 A | 12/2000 | Goodwin |
| 7,083,456 B2 | 8/2006 | Trout et al. |
| 2006/0105608 A1* | 5/2006 | Ma .............................. 439/331 |

* cited by examiner

*Primary Examiner* — Alexander Gilman
(74) *Attorney, Agent, or Firm* — Andrew C. Cheng; Wei Te Chung; Ming Chieh Chang

(57) ABSTRACT

A socket, for electrically connecting an IC package with gaps on two sides thereof and a printed circuit board, comprises an insulative housing, a plurality of contacts received in the insulative housing and a pair of engaging clumps. The insulative housing has a bottom wall and a plurality of sidewalls upwardly extending from the bottom wall, the sidewalls and the bottom wall together define a space for the IC package, two opposed sidewall further have engaging slots. The engaging clump is received in the engaging slot, and has a post entering into the space to engaging with the gap of the IC package and a transverse arm abutting against and position the IC package.

20 Claims, 5 Drawing Sheets

SOCKET HAVING ENGAGING CLUMP

BACKGROUND OF THE INVENTION

1. Field of the Invention

The present invention relates to the art of electrical connector, and more specially to a socket for electrically interconnecting two electrical interfaces, such as an IC package and a printed circuit board.

2. Description of the Prior Art

LGA connecter is widely used for electrically connecting an IC package and a printed circuit board. Since IC package has a plurality of conductive pads for transmitting a plurality of different signals and must be put in the connecter in a determinative direction, to prevent the IC package from mismating with offset front to back, the IC package defines gaps on two opposed sides thereof, and correspondingly, an insulative housing of the connector is integrally formed with projections on inner sides of two opposed sidewalls thereof to engage with the gaps on the IC package, so that the IC package can be correctly put in the connector. Related connectors are referred to U.S. Pat. Nos. 7,083,456, 6,908,316 and 6,164,980, these connectors have simple configures, however, the projections are close to passageways for contacts, and may influence an assembly of the contacts.

An improved connector comprises an insulative housing, a plurality of contacts received in the insulative housing and a pair of detachable keys. The insulative housing has a bottom wall with a plurality of passageways therethrough and a plurality of sidewalls extending from peripheral of the bottom wall and defining a receiving space for the IC package together with the bottom wall. The bottom wall is formed with two recesses corresponding to two gaps defined on the IC package, the detachable key inserts into the recess and is retained to the insulative housing after the contacts are inserted into the passageways, so the detachable key will not influence contact assembly. However, the detachable key is unreliably retained to the insulative housing and easily drops from the insulative housing.

Accordingly, a new socket that solves the above problems is desirable.

SUMMARY OF THE INVENTION

Accordingly, an object of the present invention is to provide a socket with engaging clump.

To fulfill the above object, a socket, for electrically connecting an IC package with at least one gap to a printed circuit board, comprises an insulative housing having a bottom wall and a plurality of sidewalls upwardly extending from peripheral of the bottom wall, the sidewalls and the bottom wall together defining a space for the IC package; at least one engaging clump assembled to the insulative housing, the engaging clump having a post entering into the space to engaging with the gap of the IC package and a transverse arm abutting against the IC package to position the IC package.

Other objects, advantages and novel features of the present invention will become more apparent from the following detailed description when taken in conjunction with the accompanying drawings, in which:

DESCRIPTION OF PREFERRED EMBODIMENTS OF THE INVENTION

Reference is now made to the drawings to describe the invention in detail.

Figure 1:
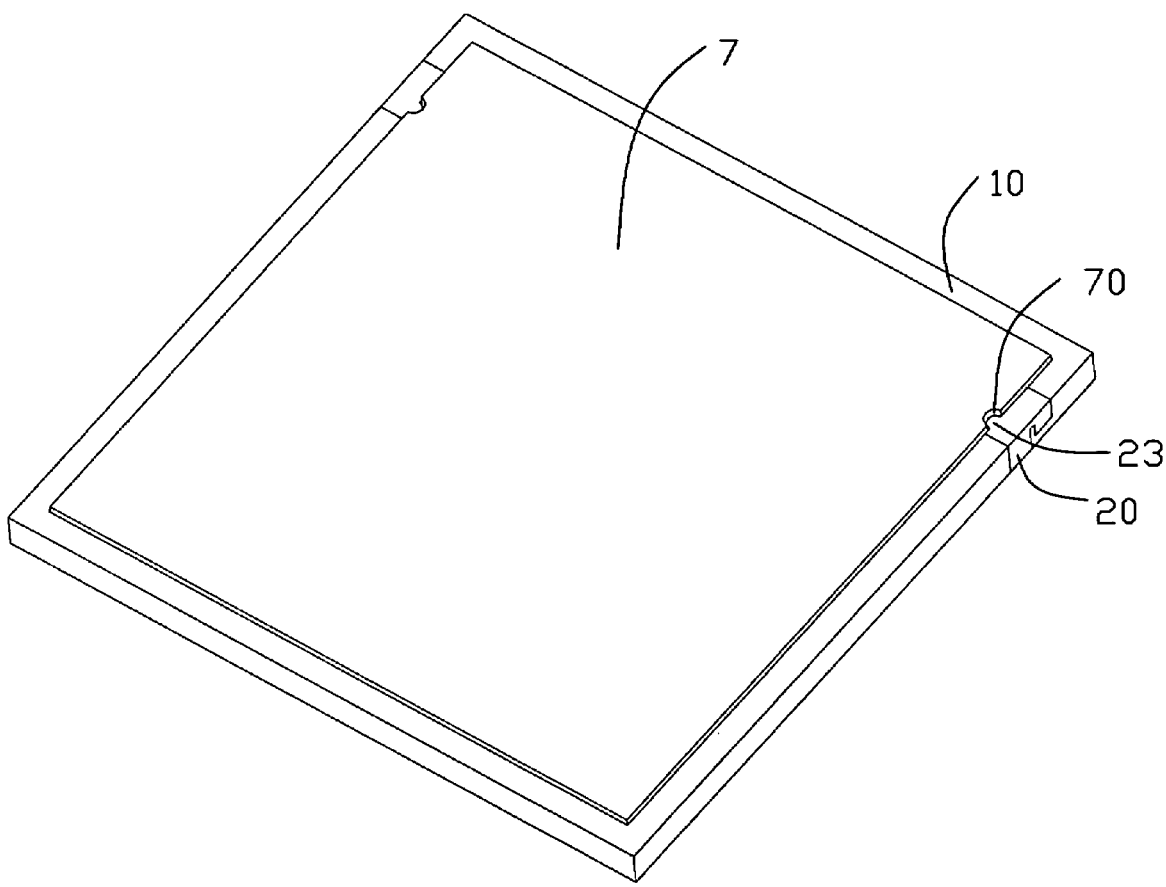
FIG. 1 is an assembled, perspective view of a socket and an IC package in accordance with a first preferred embodiment of the invention.
Figure 2:
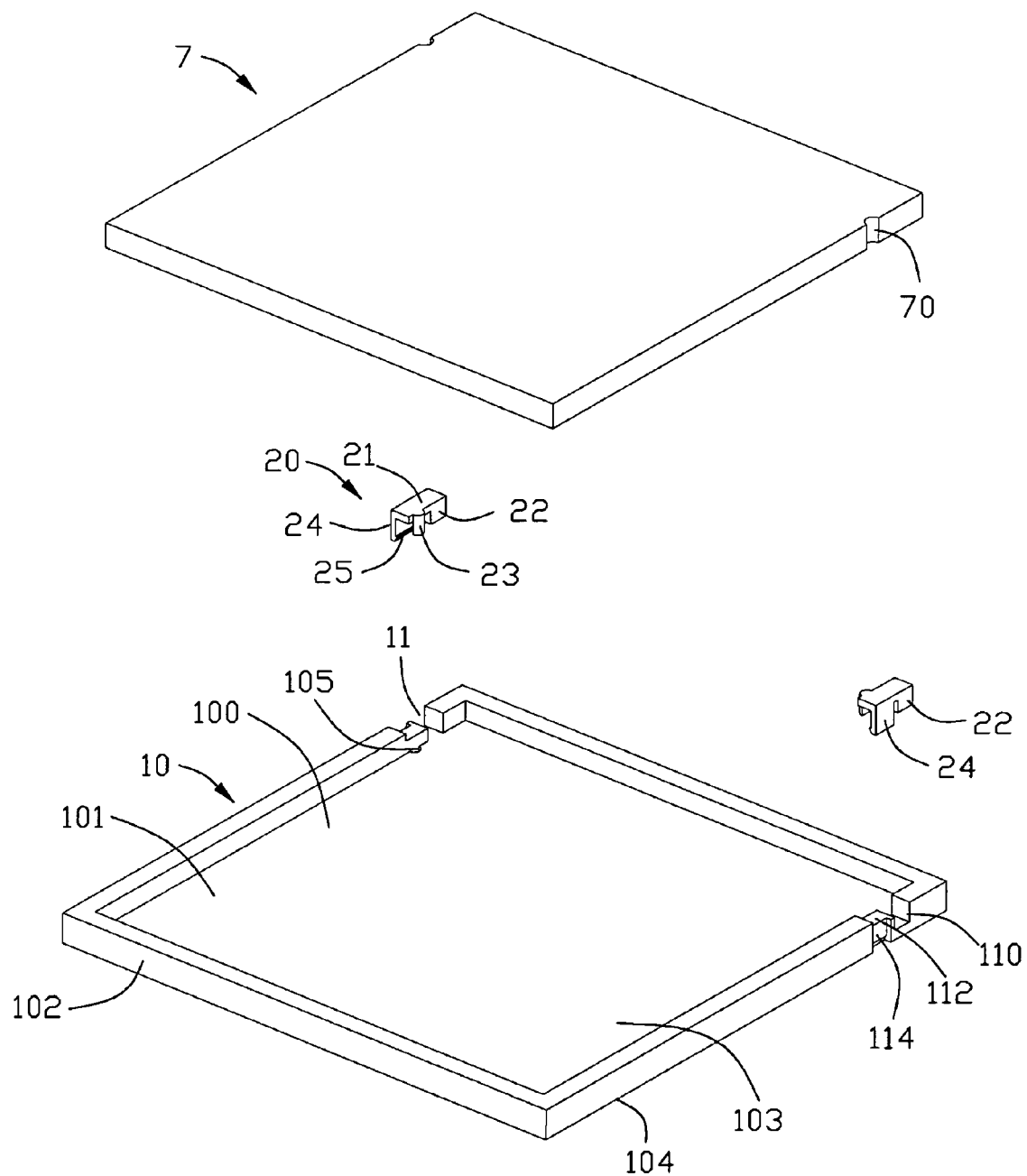
FIG. 2 is an exploded, perspective view of the socket and the IC package shown in FIG. 1.
Figure 3:
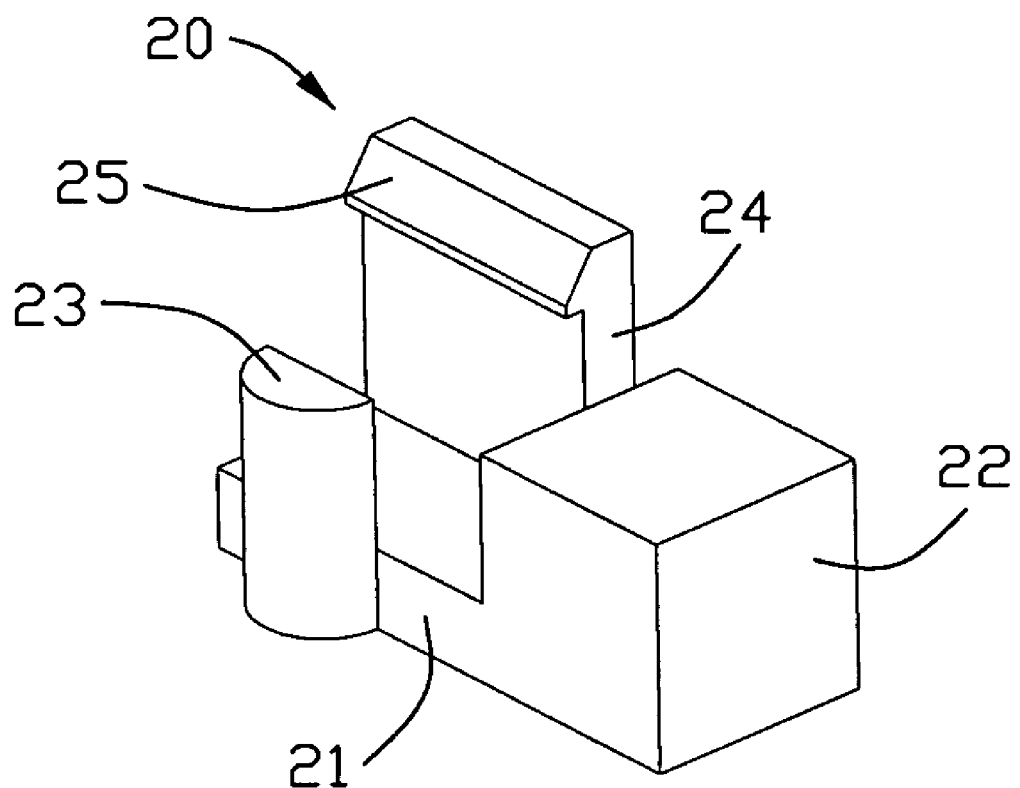
FIG. 3 is a bottom view of an engaging clump of the socket shown in FIG. 2.

Referring to FIGS. 1-3, a socket in accordance with a first preferred embodiment of the invention, for electrically connecting an IC package 7 to a printed circuit board (not shown), comprises an insulative housing 10, a plurality of contacts (not shown) received in the insulative housing 10 and a pair of engaging clumps 20. The IC package 7 defines a pair of symmetrical gaps 70 on two opposed sides thereof.

The insulative housing 10 is substantially in a rectangle shape and is formed by insert molding. The insulative housing 10 comprises a bottom wall 101 and a plurality of sidewalls 102 upwardly extending from peripheral of the bottom wall 101. The bottom wall 101 has a mating face 103 for mating with the IC package 7, a mounting face 104 opposed to the mating face 103 for mounting to the printed circuit board (not shown), and a plurality of contact holes (not shown) passing through the mating face 103 and the mounting face 104. The bottom wall 101 and the sidewalls 102 together define a space 100 for receiving the IC package 7. The bottom wall 101 defines a pair of apertures 105 corresponding to the gaps 70 of the IC package 7, the sidewalls 102 further have a pair of engaging slots 11 adjacent to the corresponding apertures 105.

The engaging clump 20 is one-piece plastic clump and has a horizontal base portion 21, the base portion 21 has a front and a rear portions, the front portion has a downwardly protruding blocking 22, the rear portion has an arc post 23 downwardly extending from an inner side thereof adjacent to the space 100 and a latching arm 24 on an out side away form the space 100 thereof, the latching arm 24 faces to the post 23 and is spaced from the post 23 by a clearance which is used for receiving a corresponding portion of the sidewall 102 of the insulative housing 10. The latching arm 24 has a clasp 25 on a bottom end thereof.

Referring to FIG. 2, the engaging slot 11 of the insulative housing 10 correspondingly has a front and a rear parts, the front part laterally passes through the sidewall 102 to form a through slot 110, the rear part is adjacent to the aperture 105 of the bottom wall 101 and is recessed from a top and an outside faces of the sidewall 102, so the rear part has a top face 12, which is lower than the top face of the sidewall 102 but higher than the mating face 103 of the insulative housing 10. The rear part further defines a latching groove 114 recessed from the outside face of the sidewall 102.

After the contacts (not shown) are assembled into the bottom wall 101, the engaging clump 20 inserts into the engaging slot 11 of the insulative housing 10, the horizontal base 21 is set upon the top face 112 of the engaging slot 11, the protruding blocking 22 is received in the through slot 110, the post 23 inserts into the aperture 105, the latching arm 24 with the clasp 25 latches with the latching groove 114, so the engaging clump 20 is retained to the sidewall 102 of the insulative housing 10. After assembly, an inner face and an outside face of the engaging clump 20 are coplanar with an inner face and the outside face of the sidewall 102, respectively.

Referring to FIG. 1, the IC package 7 is received in the space 100 of the socket, the gap 70 engages with the post 23 of the engaging clump 20 to prevent the IC package 7 from putting in the insulative housing 10 with offset front to back.

Figure 4:
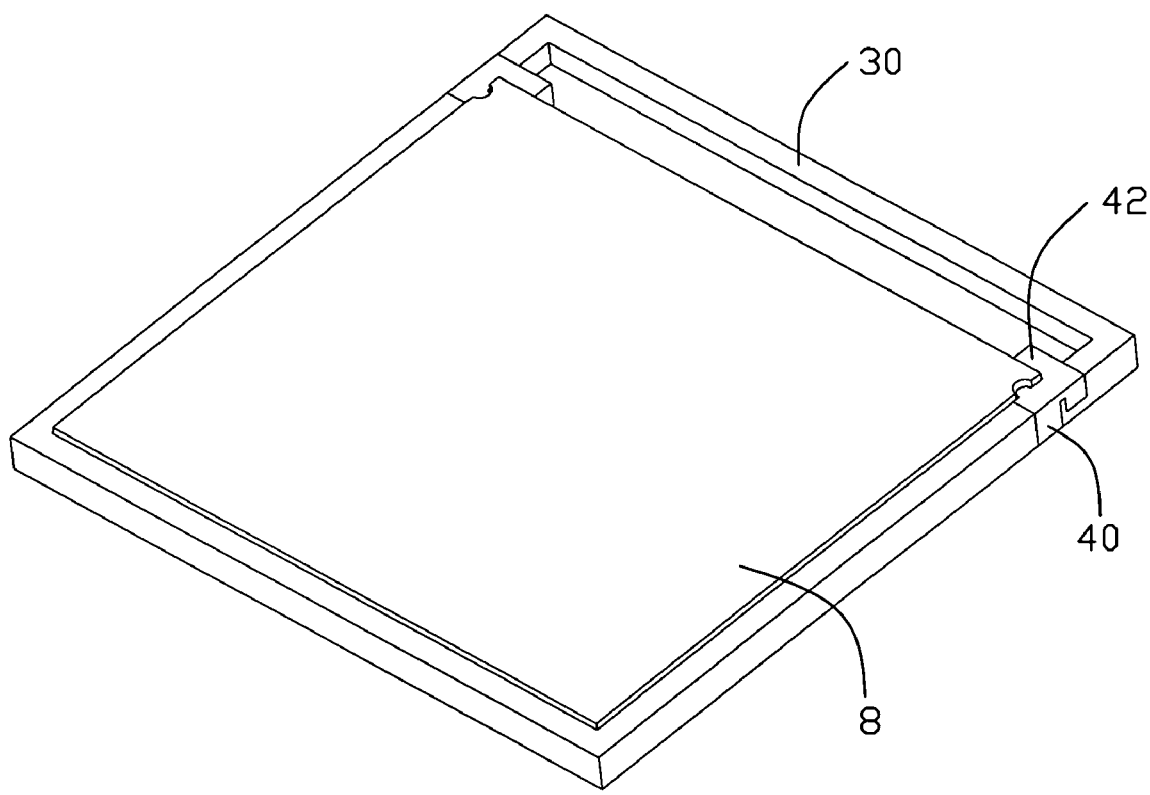
FIG. 4 is an assembled, perspective view of a socket and an IC package in accordance with a second preferred embodiment of the invention.
Figure 5:
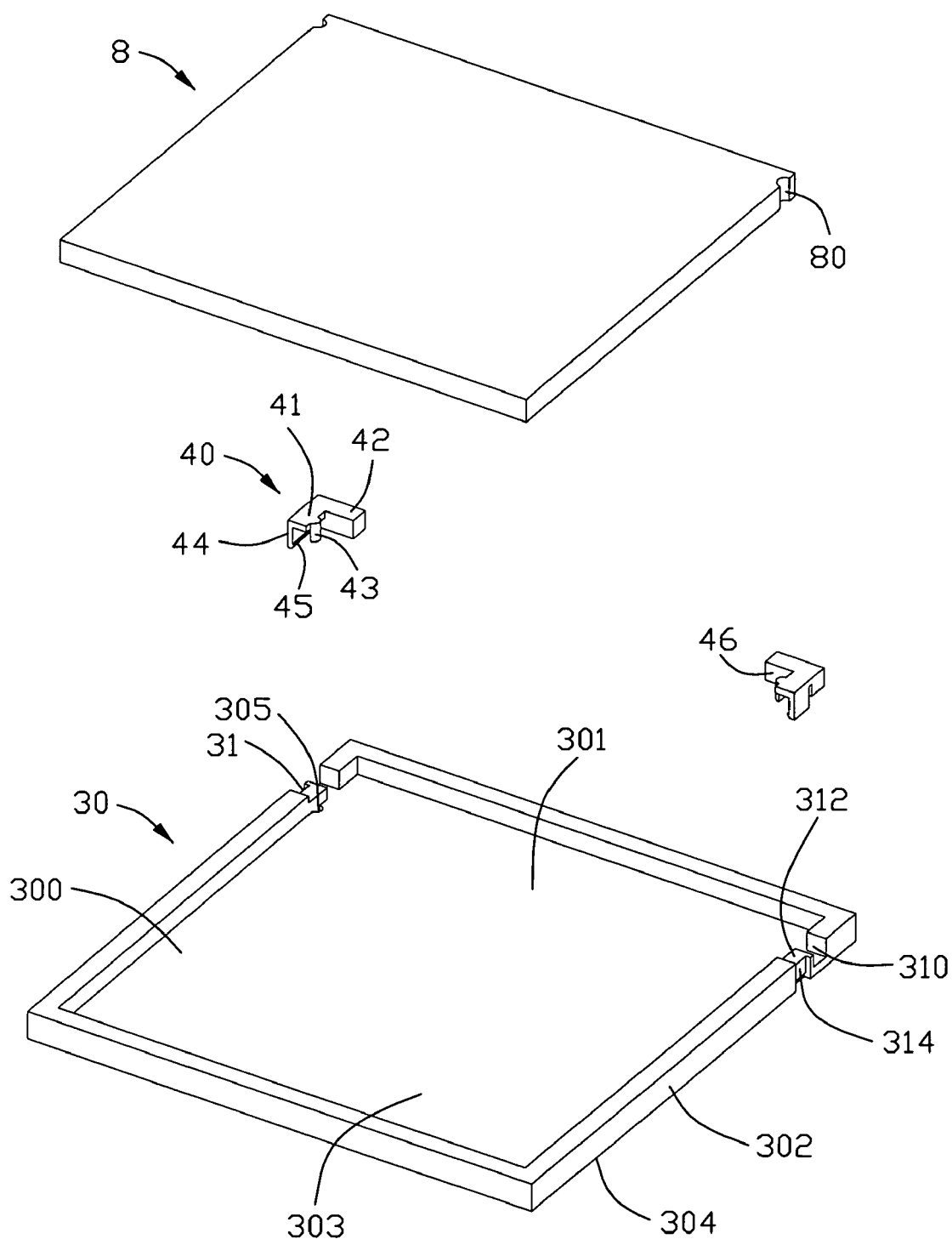
FIG. 5 is an exploded, perspective view of the socket and the IC package shown in FIG. 4.

Referring to FIG. 4 and FIG. 5, a socket in accordance with a second preferred embodiment of the invention, the insulative housing 30 has a same configure with the insulative housing 10 in the first preferred embodiment. The insulative housing 30 is substantially in a rectangle shape and is formed by insert molding. The insulative housing 30 comprises a bottom wall 301 and a plurality of sidewalls 302 upwardly extending from peripheral of the bottom wall 301. The bottom wall 301 has a mating face 303 for mating with the IC package 8, a mounting face 304 opposed to the mating face 303, and a plurality of contact holes (not shown) passing through the mating face 303 and the mounting face 304. The bottom wall 301 and the sidewalls 302 together define a space 300 for receiving the IC package 8. The bottom wall 301 defines a pair of apertures 305 corresponding to the gaps 80 of the IC package 8, the sidewalls 302 further have a pair of engaging slots 31 adjacent to the apertures 305 for receiving two engaging clumps 40.

The engaging clump 40 is one-piece plastic clump and has a reverse L-shape. The engaging clump 40 comprises a longitudinal base portion 41 and a transverse arm 42 perpendicular to the longitudinal base portion 41. The base portion 41 has an arc post 43 downwardly extending from an inner side thereof adjacent to the space 300 and a latching arm 44 extending from on an out side thereof away from the space 300 and facing to the post 43. The latching arm 44 is spaced from the post 43 by a clearance for receiving a corresponding portion of the sidewall 302 of the insulative housing 30. The latching arm 44 has a clasp 45 on a bottom end thereof. The transverse arm 42 is in a clump-like shape with a big thickness and formed with an abutting face 46 for a abutting against the IC package 80.

The engaging slot 31 of the insulative housing 30 also has a front and a rear parts, the front part of the engaging slot 31 laterally passes through the sidewall 302 and defines a through slot 310, the rear part of the engaging slot 31 is adjacent to the aperture 305 of the bottom wall 301, the rear part of the engaging slot 31 is recessed from a top face and an outside face of the sidewall 302 and has a top face 312, which is lower than the top face of the sidewall 302 but higher than the mating face 303 of the insulative housing 30. The rear part of the engaging slot 31 defines a latching groove 314 recessed from the outside face of the sidewall 102.

After the contacts (not shown) are assembled into the bottom wall 301, the engaging clump 40 inserts into the engaging slot 31 of the insulative housing 30, the base portion 41 is set upon the top face 312 of the engaging slot 31, the transverse arm 42 drills through the through slot 310 and enters into the space 300, the post 43 inserts into the aperture 305, and the latching arm 44 with the clasp 45 latches with the latching groove 314, so the engaging clump 40 is reliably retained to the insulative housing 30. After assembly, an inner face and an outside face of the engaging clump 40 are coplanar with an inner face and the outside face of the sidewall 302, respectively.

Referring to FIG. 4, the IC package 8 is received in the space 300 of the socket, the gap 80 engages with the post 43 of the engaging clump 40 to prevent the IC package 8 from putting in the insualtive housing 30 with offset front to back.

The abutting face 46 of the transverse arm 42 of the engaging clump 40 abuts against the IC package 8 to position the IC package 8 in the space 300.

The socket in accordance with the second preferred embodiment can engage with different IC packages with different sizes in length. Firstly, prepare a plurality of engaging clumps having bases with different lengths, and correspondingly adjust a length of the engaging slot of the insulative housing; then according to a length of the IC package, choose proper engaging clump and insert the engaging clump into the engaging slot of the insulative housing to engage with and position the IC package.

Furthermore, although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A socket, for electrically connecting an IC package with at least one gap to a printed circuit board, comprising:
    an insulative housing, having a bottom wall and a plurality of sidewalls upwardly extending from peripheral of the bottom wall, the sidewalls and the bottom wall together defining a space for the IC package;
    at least one engaging clump assembled to the insulative housing, the engaging clump having a longitudinal base portion, a post disposed on an inner side of the base portion to engage with the gap of the IC package and a transverse arm extending from the base portion into the space to abut against a transverse end surface of the IC package to form a mounting borderline of the IC package.

2. The socket of claim 1, wherein the transverse arm is perpendicular to the transverse arm to form an L-shape configuration together with the base portion and the post is disposed besides the transverse arm.

3. The socket of claim 2, wherein the insulative housing defines an engaging slot for receiving the engaging clump, the engaging slot defines a top face recessed from a top face of the sidewall, the base portion of the engaging clump is set upon the top face of the engaging slot.

4. The socket of claim 1, wherein the insulative housing has an engaging slot for engaging with the engaging clump, the engaging slot has a through slot laterally passing through the sidewall, and the transverse arm drills through the through slot and enters into the space.

5. The socket of claim 4, wherein the engaging slot is defined on the sidewall and comprises a latching groove recessed from an outside face of the sidewall, the engaging clump has a latching arm latching with the latching groove of the insulative housing to retain the engaging clump to the sidewall, the bottom wall of the insulative housing defines an aperture beside the engaging slot to receive the post of the engaging clump.

6. The socket of claim 5, wherein after the engaging clump is assembled to the engaging slot, an inner face and an outside face of the base portion is coplanar with an inner face and the outside face of the sidewall.

7. A socket assembly comprising:
    an insulative housing defining a bottom wall and a plurality of side walls upwardly extending from a periphery of said bottom wall and cooperating with the bottom wall to define a receiving space;
    a pair of engaging clumps being opposite to each other, respectively assembled to the corresponding opposite side walls, said pair of engaging clumps further being equipped with a pair of corresponding transverse arms opposite to and spaced from each other in a transverse direction so as to divide the space into a large region and a small region in a front-to-back direction, which is perpendicular to said transverse direction, by two sides of said pair of transverse arms under condition that a corresponding small IC package is snugly and compliantly received in the large region with restraint in the front-to-back direction due to said pair of transverse arms without invasion into the small region.

8. The socket assembly as claimed in claim 7, wherein said receiving space is dimension for snugly receiving a large IC package under condition of replacing said pair of engaging clumps with another pair of engaging clump lacking the transverse arms.

9. The socket assembly as claimed in claim 7, wherein each of said pair of engaging clumps is further equipped with a post entering the receiving space for engagement within a gap in a side edge of the IC package.

10. The socket assembly as claimed in claim 7, wherein each of said engaging clumps defines a base located in a recessed region of the corresponding side wall, and the transverse arm extends from the base.

11. The socket assembly as claimed in claim 10, wherein each of said pair of engaging clumps is further equipped with a post entering the receiving space for engagement with in a gap in side edge of the IC package.

12. The socket assembly as claimed in claim 11, wherein the post extends in a vertical direction perpendicular to said front-to-back direction and said transverse direction with a distance which is greater than a thickness dimension of said base in said vertical direction.

13. The socket assembly as claimed in claim 11, wherein in each engaging clump, the corresponding post and the corresponding transverse arm extend from different positions in said front-to-back direction.

14. The socket assembly as claimed in claim 13, wherein said receiving space is dimension for snugly receiving a large IC package under condition of replacing said pair of engaging clumps with another pair of engaging clumps lacking the transverse arms.

15. The socket assembly as claimed in claim 14, wherein said another par of engaging clumps are similar to said pair engaging clumps except without the corresponding transverse arms.

16. The socket assembly as claimed in claim 13, wherein each of said engaging clumps is further equipped with a latch arm to fasten the engaging clump to the corresponding side wall.

17. A socket assembly for mutually exclusive use with different sized large and small IC packages, comprising:
an insulative housing defining a bottom wall and a plurality of side walls upwardly extending from a periphery of said bottom wall and cooperating with the bottom wall to define a receiving space for snugly receiving the large IC package; two recessed region being formed in the corresponding side walls; a pair of first engaging clumps and a pair of second engaging clumps mutually exclusively assembled to the respective corresponding opposite side walls,
said pair of first engaging clumps further being equipped with a pair of corresponding transverse arms opposite to and spaced from each other in a transverse direction so as to divide the space into a large region and a small region in a front-to-back direction, which is perpendicular to said transverse direction, by two sides of said pair of transverse arms under condition that a corresponding small IC package is snugly and compliantly received in the large region with restraint in the front-to-back direction due to said pair of transverse arms without invasion into the small region, while said pair of second engaging clumps being equipped without said pair of corresponding transverse arms so as to allow the large IC package to be received in the receiving space.

18. The socket assembly as claimed in claim 17, wherein each of said first pair of engaging clumps is further equipped with a post for reception within a gap formed in a side edge of the small IC package.

19. The socket assembly as claimed in claim 17, wherein each of said second pair of engaging clumps is further equipped with a post for reception within a gap formed in a side edge of the large IC package.

20. The socket assembly as claimed in claim 17, wherein said pair of first engaging clumps are similar to the pair of second engaging clumps except the corresponding transverse arms.

* * * * *